United States Patent
Corbett

(10) Patent No.: US 9,600,613 B1
(45) Date of Patent: Mar. 21, 2017

(54) BLOCK-LEVEL CODE COVERAGE IN SIMULATION OF CIRCUIT DESIGNS

(71) Applicant: Xilinx, Inc., San Jose, CA (US)

(72) Inventor: Kyle Corbett, Campbell, CA (US)

(73) Assignee: XILINX, INC., San Jose, CA (US)

( * ) Notice: Subject to any disclaimer, the term of this patent is extended or adjusted under 35 U.S.C. 154(b) by 210 days.

(21) Appl. No.: 14/633,417

(22) Filed: Feb. 27, 2015

(51) Int. Cl.
*G06F 17/50* (2006.01)

(52) U.S. Cl.
CPC ...... *G06F 17/5022* (2013.01); *G06F 17/5045* (2013.01); *G06F 17/5054* (2013.01)

(58) Field of Classification Search
None
See application file for complete search history.

(56) References Cited

U.S. PATENT DOCUMENTS

| | | | |
|---|---|---|---|
| 6,237,132 B1* | 5/2001 | Dean | G06F 17/5022 703/15 |
| 9,405,864 B2* | 8/2016 | Deubzer | G06F 17/5009 |
| 2014/0039869 A1* | 2/2014 | van den Berghe | G06F 9/455 703/27 |

\* cited by examiner

*Primary Examiner* — Leigh Garbowski
(74) *Attorney, Agent, or Firm* — LeRoy D. Maunu

(57) ABSTRACT

Various example implementations are directed to methods and systems for simulating circuit designs having configuration parameters. According to one example implementation, code blocks of a circuit design for which execution of operations described by the code blocks is conditioned on a value of one or more of a set of configuration parameters, are identified. For each identified code block, a respective expression is determined that indicates whether or not the code block will be executed for different sets of values of the set of configuration parameters. The circuit design is simulated for a first set of values for the configuration parameters. The simulation is performed using a model that omits code blocks that describe sets of operations that will not be executed. The determined expressions are evaluated to determine whether or not each identified code block was realized in the simulation model.

20 Claims, 5 Drawing Sheets

BLOCK-LEVEL CODE COVERAGE IN SIMULATION OF CIRCUIT DESIGNS

FIELD OF THE INVENTION

The disclosure generally relates to integrated circuit designs, and more particularly to the simulation and testing of circuit designs.

BACKGROUND

Due to advancements in information processing technology, complex integrated circuits (ICs) can be designed using various levels of abstraction. Using a hardware description language (HDL), circuits can be designed at the gate level, the register transfer level (RTL), and higher logical levels. When designing using an HDL, the designer describes the behavior of a system in terms of signals that are generated and propagated from one set of registers to another set of registers through combinatorial logic modules. HDLs provide a rich set of constructs to describe the functionality of each module. Modules may be combined and augmented to form even higher-level modules.

System-level integration relies on the reuse of previously created designs that have been provided either from within an enterprise or from a commercial provider. Libraries of pre-developed blocks of logic have been developed that can be selected and included in a circuit design. Such library modules include, for example, adders, multipliers, filters, and other arithmetic and digital signal processing (DSP) functions from which system designs can be readily constructed. The library modules may further include memories and storage elements. The engineering community sometimes refers to these previously created designs as "design modules," "cores," "IP cores" (intellectual property cores), or "logic cores," and such terms may be used interchangeably herein. The use of pre-developed logic cores permits faster design cycles by eliminating the redesign of circuits. Thus, using cores from a library may reduce design costs. Such logic cores may often be available for purchase by third parties who desire the functionality provided by the core, but who do not have the time and/or resources necessary to design them.

Logic cores include a circuit design in the form of source code or a netlist that may be used in implementing the design in a programmable IC, such as a field programmable gate array (FPGA). Logic cores often include a number of configuration parameters that may be set to different values to adjust operation of the logic core. That is, the designer may specify a set of values for the configuration parameters to tailor certain core functionality according to the designer's needs. For ease of reference, a set of values of configuration parameters of a circuit design may be referred to as a set of configuration parameter values. The core may be integrated into a design by instantiating the code or netlist. The logic core is then placed and routed along with the rest of the design to provide the desired functionality.

SUMMARY

Various example implementations are directed to methods and systems for simulating circuit designs having configuration parameters. As one example, a method is disclosed for evaluating block-level code coverage of a simulation of a circuit design. The method identifies code blocks of the circuit design for which execution of operations described by the code blocks is conditioned on a value of one or more of a set of configuration parameters. For each identified code block, a respective expression is determined. The expression indicates whether or not the operations described by the code block will be executed for different sets of values of the set of configuration parameters. Using a simulation model generator that removes code blocks for which operations indicated by the code blocks are not executed, a first simulation model of the circuit design configured with the first set of values for the configuration parameters is generated and executed. The determined expressions are evaluated to determine whether or not each identified code block was realized in the simulation model. Data is stored that indicates the code blocks which were determined to be realized in the simulation of the circuit design configured with the first set of values.

A method is also disclosed for simulating a circuit design. The method identifies code blocks of the circuit design for which execution of operations described by the code block is conditioned on a value of one or more of a set of configuration parameters. For each identified code block, a respective expression is determined. The expression indicates whether or not operations described by the code block will be executed for different sets of values of the set of configuration parameters. A subset of the different sets of values are selected as a function of the determined expressions. For each set of values in the subset, a respective simulation model is generated for the circuit design. The simulation model is generated using a simulation model generator that removes code blocks for which operations indicated by the code blocks are not executed. Each simulation model is executed to simulate the circuit design.

A system for simulating a circuit design is also disclosed. The system includes one or more processors and a memory arrangement coupled to the one or more processors. The memory arrangement is configured with instructions that when executed by the one or more processors cause the one or more processors to identify code blocks in the circuit design for which execution of operations described by the code blocks is conditioned on a value of one or more of a set of configuration parameters of the circuit design. The instructions further cause the processor(s) to determine a respective expression for each identified code block. The respective expression indicates whether or not the operations described by the code block will be executed for different sets of values of the set of configuration parameters.

The instructions further cause the processor(s) to generate and execute a simulation model of the circuit design configured with a first set of values for the configuration parameters. The simulation model is generated using a simulation model generator that removes code blocks for which operations indicated by the code blocks are not executed. The processor(s) evaluates the expressions to determine whether or not each identified code block was realized in the simulation of the circuit design. The processor(s) stored data that indicates the code blocks that were determined to be realized in the simulation of the circuit design.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings, in which.

DETAILED DESCRIPTION

Figure 1:
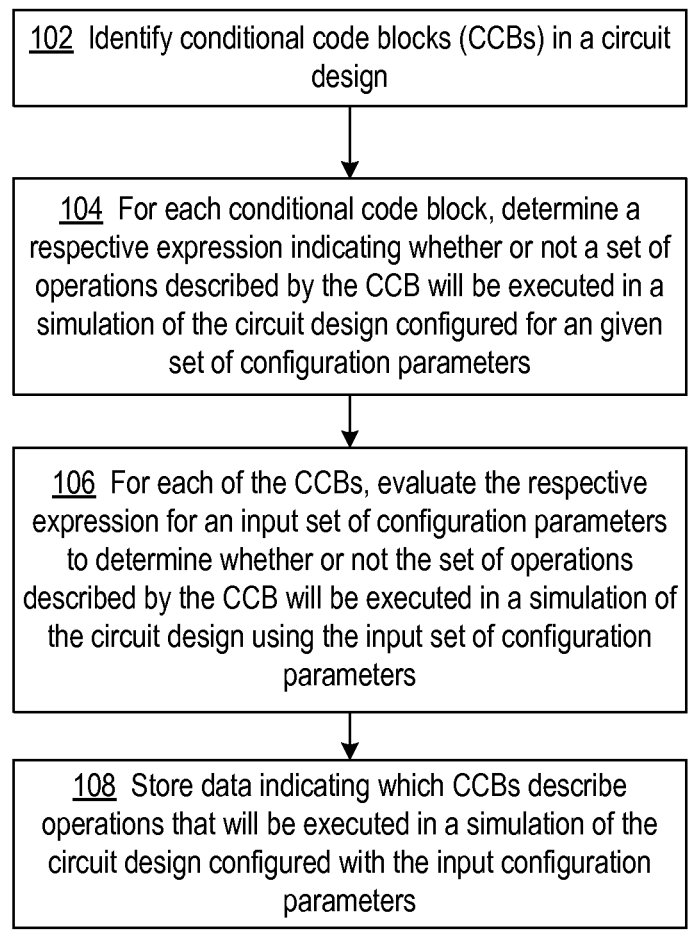
FIG. 1 shows an example process for evaluating block level code coverage of simulations for various values of configuration parameters of a circuit design.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Logic cores often include a number of configuration parameters that may be configured to adjust functions provided by the logic core. Depending on the parameter values specified by a designer, operations described by different blocks of code of the logic core may or may not be executed during simulation or operation of a realized circuit. For example, a transmitter logic core may be configured to encode data using various communication protocols depending on values of the configuration parameter. The circuit design for the logic core may include a first code block for encoding data with first communication protocol and a second code block for encoding data with a second communication protocol. If the logic core is configured to use the first communication protocol, the second code block is not used in the operation of the logic core. Conversely, if the logic core is configured to use the second communication protocol, the first code block is not used in the operation of the logic core.

Before logic cores are distributed for use by designers in larger designs, it is standard practice to simulate the circuit design of the logic core for various input and parameter values to ensure that all portions of the logic core operate correctly. One metric used to evaluate adequacy of the testing is code coverage. Code coverage analyzes a simulation model of a circuit design to determine which code statements of the simulation model are executed, and thereby tested, when simulated for a particular set of input data and set of values of configuration parameters. If untested portions of the circuit design are discovered, input data and/or configuration parameters are adjusted and simulation is repeated with the objective of testing the untested portion.

Before a simulation model of a circuit design is created, the circuit design is typically compiled, elaborated, and optimized for a particular set of values for the configuration parameters. As one common optimization, portions of a circuit design that are unused for a set of values of the configuration parameters may be removed from the design. This optimization helps provide configuration and performance of the circuit design for testing that is similar to expected use by a circuit designer. The optimization also reduces processing time needed to simulate the resulting circuit design.

Current code coverage tools only analyze whether or not code statements realized in a simulation model have been executed for input data values. This makes it very difficult to analyze code coverage of code blocks that may be removed for certain values of the configuration parameter during optimization of the circuit design before the simulation model was created. For instance, some prior approaches would simulate a logic core using every combination of parameters to ensure that code coverage analysis had been performed for all code blocks. For ease of reference, a code block of a circuit design, for which execution of operations described by the code block is dependent on the value of one or more configuration parameters, may be referred to as a conditional code block.

Methods and systems are disclosed for simulating circuit designs and performing block-level code coverage analysis of conditional code blocks. The block-level code coverage analysis determines, for a conditional code block, whether or not any operations described by the code block will be executed during simulation.

In an example implementation, a method is disclosed for evaluating block-level code coverage of a circuit design configured for a particular set of values of the configuration parameters. The method identifies code blocks of the circuit design for which execution of operations described by the code blocks is conditioned on a value of one or more of the configuration parameters. For each identified code block, a respective expression is determined. The expression indicates whether or not the operations described by the code block, as a whole, will be executed for different sets of values of the set of configuration parameters. A first simulation model of the circuit design configured with the first set of values for the configuration parameters is generated. The simulation model is generated using a simulation model generator that removes code blocks for which operations indicated by the code blocks are not executed. The simulation model is executed to simulate the circuit design for the first set of values. The determined expressions are evaluated to determine whether or not each identified code block was realized in the simulation of the circuit design. In this manner, conditional code blocks that are removed from a circuit design during optimization, and therefore not tested in simulation, can be identified.

The determined expressions for the conditional code blocks may be used to perform a number of useful functions in connection with simulation and/or testing of the circuit design. For example, the determined expressions may be used to identify untested code or to improve testing efficiency by identifying sets of values of configuration parameters that achieve block-level code coverage of the conditional code blocks.

Turning now to the figures, FIG. 1 shows an example process for evaluating block level code coverage of simulations for various sets of values of configuration parameters of a circuit design. At block 102, conditional code blocks in the circuit design are identified. At block 104, a respective expression is determined for each conditional code block. The expression indicates whether or not a set of operations described by the conditional code block will be executed in the simulation of the circuit design using various sets of values for the configuration parameters. At block 106, the respective expression for each conditional code block is evaluated for an input set of configuration parameters to determine whether or not the set of operations described by the conditional code block will be executed in a simulation of the circuit design using the input set of configuration parameters. At block 108, data is stored, and the stored data indicates which conditional code block(s) describe operations that will be executed in a simulation of the circuit design with the input configuration parameters.

Various processes may be used to identify conditional code blocks at block 102 and determine the respective expressions at block 104. In one example process, a circuit design is analyzed by traversing elaborated source code of the circuit design. While traversing the elaborated source code, ports and code blocks that are not conditioned on the set of configuration parameters are removed from the elaborated source code. Function, parameter, and constant declarations, function instantiations (e.g., function calls), and conditional expressions are left in the elaborated source code. The conditional expressions are logical statements indicating criteria for execution of code. Each instantiation of a function conditioned on one or more configuration parameters is a conditional code block and is given a unique identifier.

To determine the expressions for the identified code blocks at block 104 in FIG. 1, the hierarchy of the design is flattened in the top level. Flattening the circuit design adjusts the conditional expressions in terms of top level hierarchy. As an illustrative example, a top level module Top( ) may include an instance of a module Mid( ) whose execution is conditioned on parameter X having a value greater than 20 (i.e., if (X>20)). Similarly, the module Mid( ) may include an instance of a module Bot( ), whose execution is conditioned on the parameter X having a value less than 20 (i.e., if (X<20)). When the design hierarchy is flattened, the conditional expression for execution of the module Bot( ) becomes: if (X<20 && X>10). The resulting conditional expression indicates whether or not the instance of Bot( ) will be executed in a simulation for different values of the parameter X. It is recognized that various other processes may be used to identify conditional code blocks at block 102 and generate respective expressions at block 104.

Figure 2:
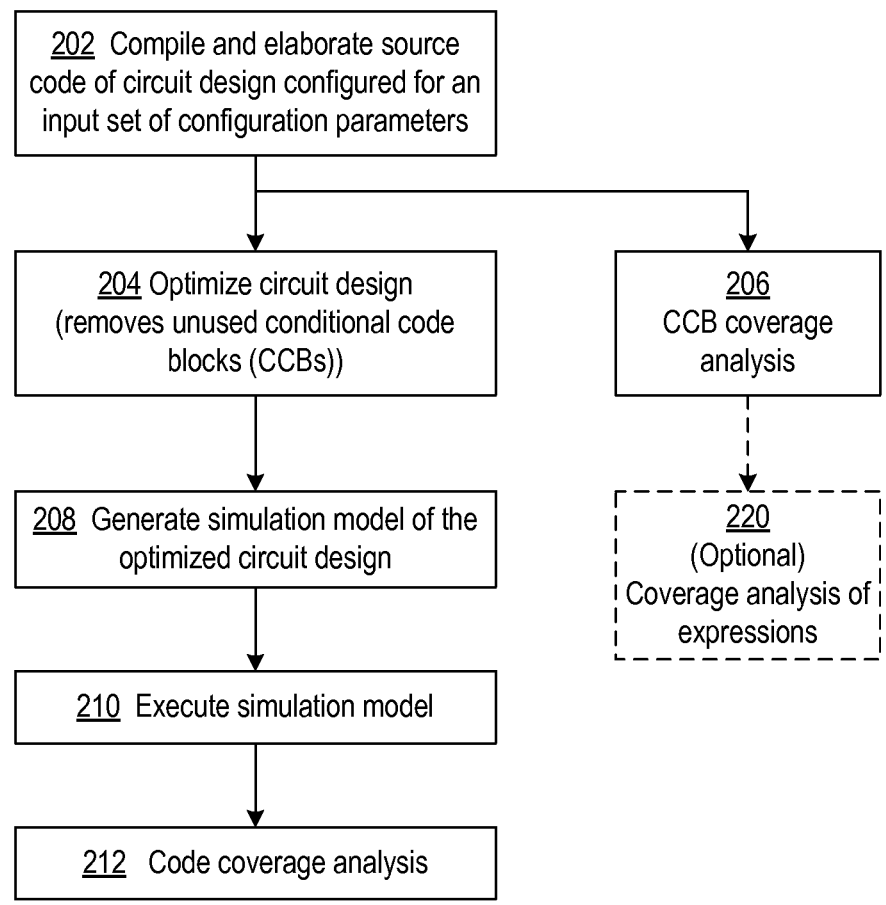
FIG. 2 shows an example process for simulating a circuit design and evaluating code coverage.

FIG. 2 shows an example process for simulating a circuit design and evaluating code coverage. At block 202, source code of a circuit design is compiled and elaborated for an input set of values for configuration parameters of the circuit design. At block 204, the compiled and elaborated circuit design is optimized to remove code blocks that describe respective sets of operations that will not be executed during simulation. At block 208, a simulation model is generated for the optimized circuit design. When the simulation model is generated, any code blocks that were removed at block 204 are not realized in the simulation model. The simulation model is executed at block 210. At block 212, code coverage analysis is performed to identify code statements realized in the simulation model that are not executed in the simulation.

As previously noted, conditional code blocks may be removed at block 204 and thus not be realized in the simulation model. As such, the removed code blocks are not analyzed by the code coverage analysis at block 212. Accordingly, the code coverage analysis at block 212 will fail to identify code statements of the conditional code blocks as not being executed. At block 206, block level code coverage analysis is performed to identify conditional code blocks that were not realized in the simulation model and thus not analyzed in the code coverage analysis at block 212. The block level code coverage analysis may be performed, for example, by evaluating respective expressions of the conditional code blocks for the input set of values of the configuration parameters, as described with reference to FIG. 1.

For some circuit designs, one or more of the expressions may include multiple code statements that are evaluated to determine whether or not operations described by the corresponding conditional code block will be executed in simulation. In some implementations, the process in FIG. 2 may be adapted to perform the optional flow, illustrated by dashed lines in FIG. 2. At block 220, the process evaluates code coverage of the expressions, for example, to identify code statements of the expressions that were not executed in the analysis performed at block 206.

Figure 3:
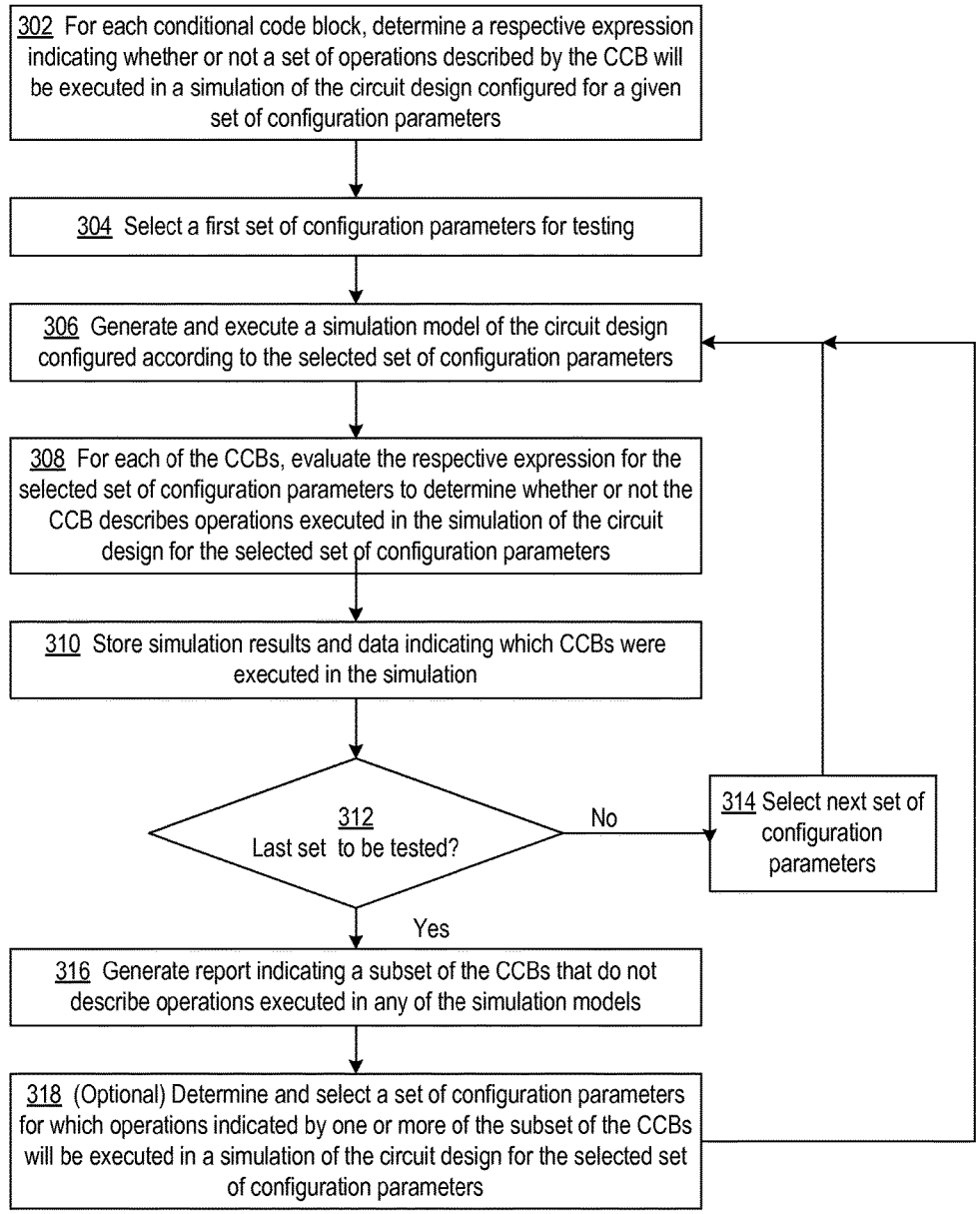
FIG. 3 shows an example process for tracking block-level code coverage in simulating a circuit design for a plurality of sets of values for configuration parameters of the circuit design.

FIG. 3 shows an example process for determining block level code coverage in simulating a circuit design for multiple sets of values of configuration parameters. At block 302, a respective expression is determined for each conditional code block. The expression indicates whether or not the conditional code block describes a set of operations that will be executed in the simulation of the circuit design configured with a given set of values of the configuration parameters. At block 304, a first set of values of the configuration parameters is selected for testing. At block 306, a simulation model is generated for simulation of the circuit design configured according to the selected set of values of the configuration parameters. At block 308, the respective expression for each of the conditional code blocks is evaluated for the selected set of values of the configuration parameters to determine whether or not the set of operations described by the conditional code block was executed in the simulation of the circuit design for the selected set of values of the configuration parameters. At block 310, simulation results and data, indicating which conditional code blocks describe operations that were executed in the simulation, are stored.

At decision block 312, if the selected set of values of the configuration parameters is not the last set to be tested, the process selects the next set of values of the configuration parameters at block 314. The generation, simulation, evaluation, and storing processes are repeated at blocks 306, 308, and 310 for the circuit design configured with the new selected set of values of the configuration parameters. When there are no more sets of parameters to be tested, decision block 312 directs the process to block 316. At block 316, a report is generated that indicates a subset of the conditional code blocks which describe sets of operations that were not executed in any of the simulations of the circuit design.

In some implementations, the process may be adapted to include an optional flow. At block 318, the process optionally determines and selects a set of values of the configuration parameters for which operations indicated by one or more of the subset of code blocks will be executed in a simulation of the circuit design configured with the set of values. The process then returns to block 306, where a simulation model is generated for simulation of the circuit design configured according to the new set of values of the configuration parameters. The simulation will perform operations described by at least one of the conditional code blocks which were not performed in the previous simulations. As such, code coverage is improved.

Figure 4:
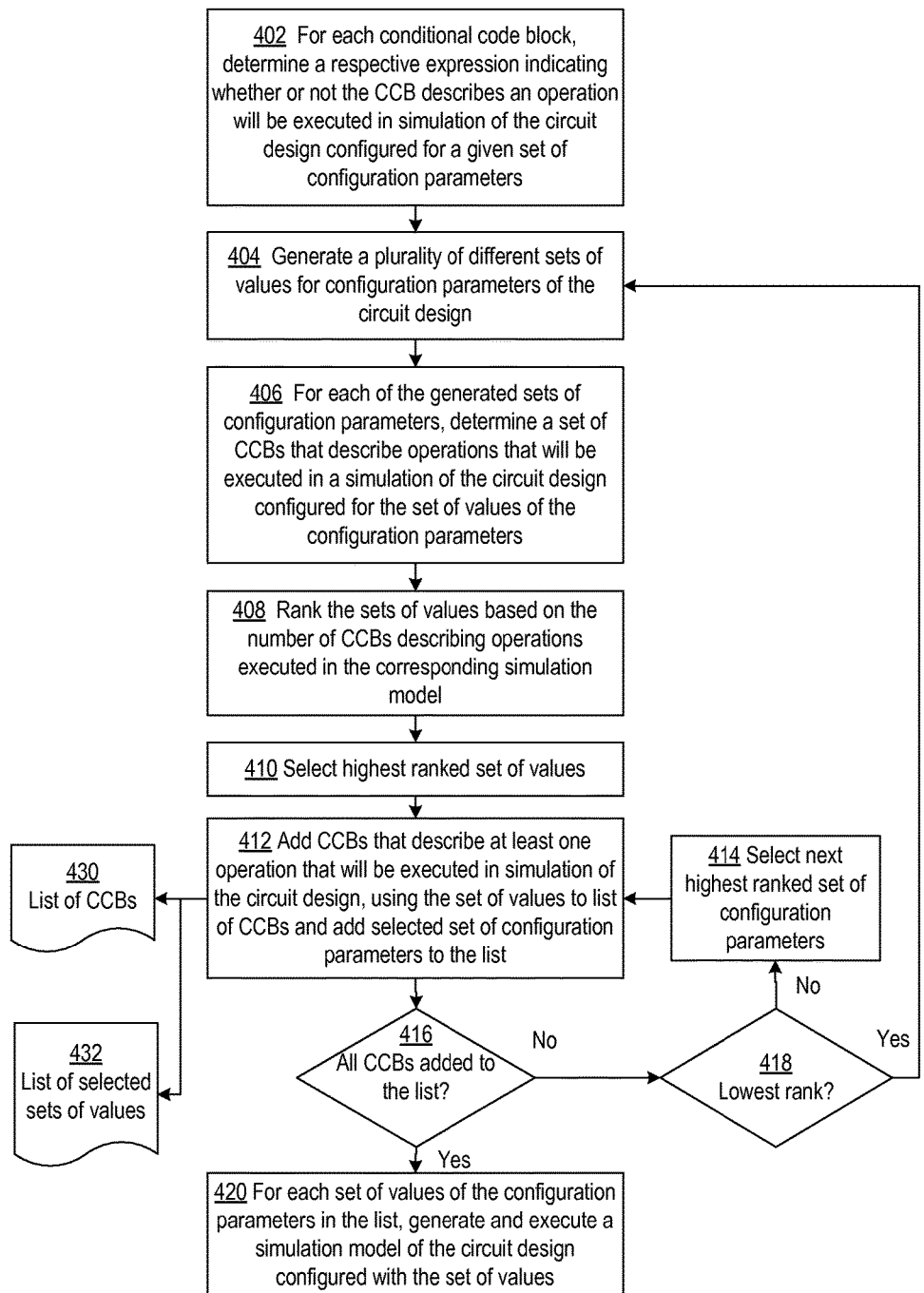
FIG. 4 shows an example process for determining one or more sets of values for configuration parameters for providing block level code coverage in simulation of the circuit design.

FIG. 4 shows an example process for determining one or more sets of values of a set of configuration parameters for ensuring block level code coverage in simulation of the circuit design. At block 402, a respective expression is determined for each conditional code block. The expression indicates whether or not a set of operations described by the conditional code block will be executed in the simulation of the circuit design configured with a given set of configuration parameters. At block 404, a plurality of different sets of values of the configuration parameters of the circuit design are generated. For each of the generated sets of values, the process determines, at block 406, a respective set of conditional code blocks that describe operations that will be executed in a simulation of the circuit design for the set of values for the configuration parameters.

At block 408, the sets of values are ranked based on the number of conditional code blocks that describe operations executed in simulation of the circuit design using the sets of values for the configuration parameters. At block 410, the highest ranked set of values is selected. At block 412, conditional code blocks that describe operations that will be executed in simulation of the circuit design with the selected set of values are added to a list of conditional code blocks 430. Also at block 412, the selected set of values of the configuration parameters is also added to list 432.

If all conditional code blocks in the circuit design have been added to the list 430, simulation of the circuit design for each of the sets of values in list 432 will achieve block level code coverage of the conditional code blocks. Accordingly, if all conditional code blocks in the circuit design have been added to the list 430, decision block 416 directs the process to generate and execute a simulation model of circuit design at block 420 for each set of values of the configuration parameters in the list.

If not all conditional code blocks in the circuit design have been added to the list 430, decision block 416 directs the process to block 418. If the selected set of values is not the lowest ranked set of values, decision block 418 directs the process to select the next lower ranked set of values at block 414. The process performed by block 412 is repeated for the new selected set of values. In this simplified process example, the process at block 412 adds the conditional code blocks of the selected set of values without further analysis. In some implementations, at block 412, the process may compare the conditional code blocks determined to describe operations executed by simulation with the selected set of values to the conditional code blocks in the list 430 to determine if coverage is improved. If coverage provided by the selected set of values of the configuration parameters is entirely redundant to the code blocks in the list 430, the process may continue to decision block 416 without modifying list 430 or list 432.

If the selected set of values is the lowest ranked set at decision block 418, each of the plurality of sets has already been processed at block 412 but at least one conditional code block is missing from list 430. If the plurality of sets of values generated at block 404 did not include all possible sets of values, new sets may be generated and the process may continue. In this example, if the selected set of values is the lowest ranked set, decision block 418 directs the process to generate a second plurality of sets of values at block 404 and continue the process until all conditional code blocks in the circuit design have been added to the list 430 when the process reaches decision block 416.

In different implementations, various numbers of sets of values may be generated at block 404. In some implementations, the plurality of sets generated at block 404 may include each possible set of values for the configuration parameters. In such implementations, the process will exit if the lowest ranked set is selected when the process reaches block 418. However, it is likely that full coverage will be achieved with a subset of the possible sets of values. In some implementations, the plurality of sets generated at block 404 is a subset of all possible sets of values. By initially generating a smaller number of sets, processing time for analysis at block 406, 408, and 410 may be reduced.

In some implementations, the process may be adapted to analyze each of the possible set of values to determine the smallest combination of the sets of values for which operations described in each conditional code block is executed at least once in simulation of the circuit design for the sets of values. By determining the smallest combination of the sets, the number of simulations needed to achieve complete code coverage is minimized.

Figure 5:
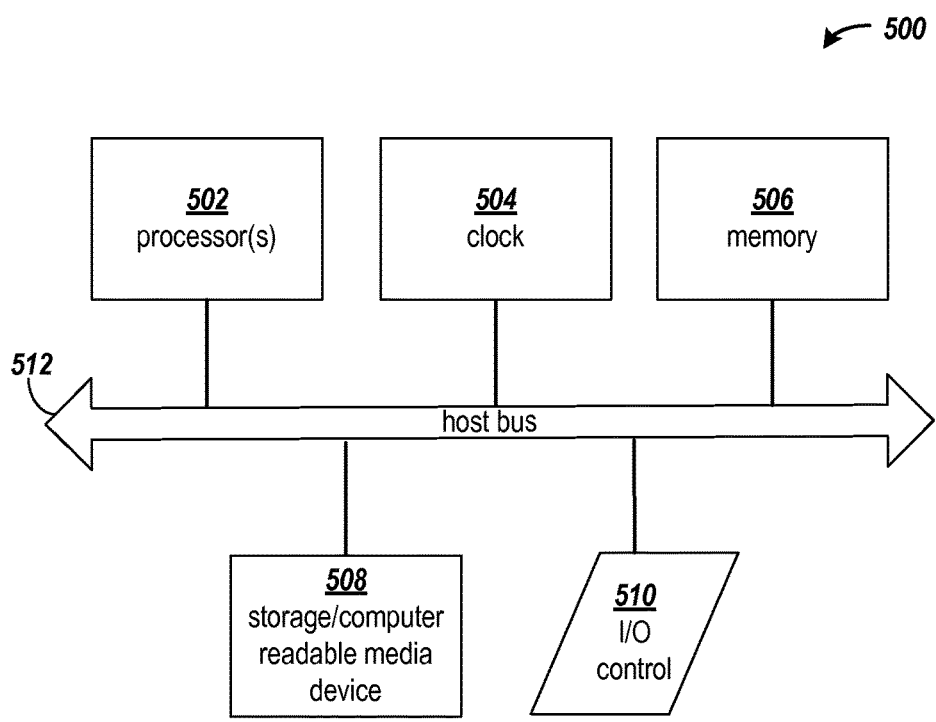
FIG. 5 shows a block diagram of a computing arrangement for implementing the processes described herein.

FIG. 5 shows a block diagram of an example computing arrangement that may be configured to implement the processes described herein. It will be appreciated that various alternative computing arrangements, including one or more processors and a memory arrangement configured with program code, would be suitable for hosting the disclosed processes. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 500 includes one or more processors 502, a clock signal generator 504, a memory arrangement 506, a storage arrangement 508, and an input/output control unit 510, all coupled to a host bus 512. The arrangement 500 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 502 may be one or more general purpose processors, or a combination of one or more general purpose processors and suitable co-processors, or one or more specialized processors (e.g., RISC, CISC, pipelined, etc.).

The memory arrangement 506 typically includes multiple levels of cache memory, and a main memory. The storage arrangement 508 may include local and/or remote persistent storage, such as provided by magnetic disks (not shown), flash, EPROM, or other non-volatile data storage. The storage unit may be read or read/write capable. Further, the memory arrangement 506 and storage arrangement 508 may be combined in a single arrangement.

The processor(s) 502 executes the software in storage arrangement 508 and/or memory arrangement 506, reads data from and stores data to the storage arrangement 508 and/or memory arrangement 506, and communicates with external devices through the input/output control arrangement 510. These functions are synchronized by the clock signal generator 504. The resource of the computing arrangement may be managed by either an operating system (not shown), or a hardware control unit (not shown).

Those skilled in the art will appreciate that various alternative computing arrangements, including one or more processors and a memory arrangement configured with program code, would be suitable for hosting the processes and data structures disclosed herein. In addition, the processes may be provided via a variety of computer-readable storage media or delivery channels such as magnetic or optical disks or tapes, electronic storage devices, or as application services over a network.

The methods and systems are thought to be applicable to a variety of systems for simulating circuit designs. Other aspects and features will be apparent to those skilled in the art from consideration of the specification. For instance, although aspects and features may in some cases be described in individual figures, it will be appreciated that features from one figure can be combined with features of another figure even though the combination is not explicitly shown or explicitly described as a combination. The methods and systems may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method, comprising:
Identifying, in a circuit design, code blocks for which execution of operations indicated by the code blocks is conditioned on a value of one or more of a set of configuration parameters of the circuit design;
determining, for each identified code block, a respective expression indicating whether or not the operations indicated by the code block will be executed for different sets of values of the set of configuration parameters; and
for a first set of values of the different sets of values:
generating, using a simulation model generator that removes code blocks for which operations indicated by the code blocks are not executed, a first simulation model of the circuit design configured with the first set of values for the configuration parameters;
executing the first simulation model;
evaluating the determined expressions to determine whether or not each identified code block was realized in the simulation of the circuit design configured with the first set of values for the configuration parameters; and
storing a first set of data indicative of ones of identified code blocks determined to be realized in the simulation of the circuit design configured with the first set of values.

2. The method of claim 1, further comprising evaluating, in response to executing the simulation model, the first set of data to determine a subset of code blocks that were not included in the simulation model of the circuit design with the first set of values.

3. The method of claim 2, further comprising:
determining, using the determined respective expressions, a second set of values of the configuration parameters for which operations indicated by one or more of the subset of code blocks will be executed in a simulation of the circuit design configured with the second set of values for the configuration parameters;
generating, using a simulation model generator, a second simulation model of the circuit design configured with the second set of values for the configuration parameters; and
executing the second simulation model.

4. The method of claim 3, further comprising storing a second set of data indicative of the ones of identified code blocks that were realized in the second simulation model of the circuit design.

5. The method of claim 1, wherein:
the first simulation model includes a plurality of code statements; and
the method further comprises storing, in response to executing the first simulation model, a respective set of data indicating code statements of the first simulation model that were not executed in the executing of the first simulation model.

6. The method of claim 1, wherein:
the respective expression for at least one identified code block includes a plurality of code statements; and
the method further comprises determining which of the plurality of code statements are executed in the evaluating of the respective expression.

7. The method of claim 1, further comprising determining, using the expressions determined for the identified code blocks, a subset of the different sets of values of the set of configuration parameters for which operations described by each of the identified code blocks will be executed at least once in simulating the circuit design for each of the subset of the different sets of values.

8. The method of claim 7, further comprising determining, using the expressions determined for the identified code blocks, a smallest subset of the different sets of values of the set of configuration parameters for which each of the identified code blocks will be executed at least once in simulating the circuit design for each of the subset of the different sets of values.

9. The method of claim 1, wherein the identifying code blocks of the circuit design includes:
traversing the circuit design to identify configuration parameters; and
identifying portions of code for which execution of operations described by the portions of code is conditioned on one or more of the identified configuration parameters.

10. A method, comprising:
Identifying, in a circuit design, code blocks for which execution is conditioned on a value of one or more of a set of configuration parameters;
determining, for each identified code block, a respective expression indicating whether or not the code block will be executed in simulation of the circuit design for different sets of values of the set of configuration parameters;
selecting a subset of the different sets of values as a function of the determined expressions; and
for each set of values in the subset:
generating, using a simulation model generator that removes code blocks for which operations indicated by the code blocks are not executed, a simulation model of the circuit design configured with the set of values for the configuration parameters; and
executing the simulation model to simulate the circuit design configured with the set of values of the configuration parameters.

11. The method of claim 10, wherein the subset of the different sets of values includes, for each of the identified code blocks, at least one set of values for which operations described by the code block will be executed in simulation of the circuit design using the set of values of the configuration parameters.

12. The method of claim 10, wherein the subset of the different sets of values is the smallest subset of the different sets of values wherein, for each of the identified code blocks, at least one set of values for which operations described by the code block will be executed in simulation of the circuit design using the set of values of the configuration parameters.

13. The method of claim 10, wherein the generating of the simulation model for a set of values in the subset includes:

compiling the circuit design with configuration parameters set to the set of values;
removing code blocks from the compiled circuit design for which operations indicated by the code blocks will not be executed in simulation of the circuit design with configuration parameters set to the set of values; and
generating the simulation model from the compiled circuit design.

14. The method of claim 10, wherein:
the simulation model includes a plurality of code statements; and
the method further comprises identifying, in response to executing the simulation model, code statements of the simulation model whose described operations were not executed in the executing of the simulation model.

15. The method of claim 10, wherein:
the respective expression for at least one identified code block includes a plurality of code statements; and
the method further comprises determining which of the plurality of code statements are executed in the evaluating of the respective expression.

16. The method of claim 10, wherein the identifying code blocks of the circuit design includes:
traversing the circuit design to identify configuration parameters; and
identifying portions of code whose execution is conditioned on one or more of the identified configuration parameters.

17. A system, comprising:
one or more processors; and
a memory arrangement coupled to the one or more processors, wherein the memory arrangement is configured with instructions that when executed by the one or more processors cause the one or more processors to perform operations including:
identifying, in a circuit design, code blocks for which execution is conditioned on a value of one or more of a set of configuration parameters of the circuit design;
determining, for each identified code block, a respective expression indicating whether or not the code block will be executed for different sets of values of the set of configuration parameters; and
for a first set of values of the different sets of values:
generating, using a simulation model generator that removes code blocks for which operations indicated by the code blocks are not executed, a first simulation model of the circuit design configured with the first set of values for the configuration parameters;
executing the first simulation model;
evaluating the determined expressions to determine whether or not each identified code block was realized in the simulation of the circuit design configured with the first set of values for the configuration parameters; and
storing a first set of data indicative of ones of identified code blocks determined to be realized in the simulation of the circuit design configured with the first set of values.

18. The system of claim 17, wherein the generating of the first simulation model includes:
compiling the circuit design with configuration parameters set to the first set of values;
removing, from the compiled circuit design, code blocks for which operations described by the code blocks will not be executed; and
generating a simulation model from the compiled circuit design.

19. The system of claim 17, wherein the instructions further cause the one or more processors to perform operations including:
evaluating, in response to the simulating of the circuit design by executing the first simulation model, the set of data to determine a subset of code blocks that were not realized in the first simulation model of the circuit design with the first set of values;
determining, using the determined respective expressions, a second set of values of the configuration parameters for which operations described by one or more of the subset of code blocks will be executed in a simulation of the circuit design configured with the set of values for the configuration parameters; and
simulating the circuit design configured with the second set of values for the configuration parameters.

20. The system of claim 17, wherein the identifying code blocks of the circuit design includes:
traversing the circuit design to identify configuration parameters, and
identifying portions of code whose execution is conditioned on one or more of the identified configuration parameters.

* * * * *